United States Patent [19]

DeJong

[11] 3,903,428

[45] Sept. 2, 1975

[54] SOLAR CELL CONTACT DESIGN

[75] Inventor: Pieter N. DeJong, Bellevue, Wash.

[73] Assignee: Hughes Aircraft Company, Culver City, Calif.

[22] Filed: Dec. 28, 1973

[21] Appl. No.: 429,431

[52] U.S. Cl. .................. 250/578; 250/211 J; 357/30

[51] Int. Cl. .............................................. H01j 39/12

[58] Field of Search ............. 250/211 R, 211 J, 208, 250/578; 317/235 N

[56] References Cited

UNITED STATES PATENTS

| | | | |
|---|---|---|---|
| 2,629,802 | 2/1953 | Pantchechnikoff | 250/211 J |
| 2,735,919 | 2/1956 | Shower | 250/211 J |
| 2,963,390 | 12/1960 | Dickson | 317/235 N |
| 3,411,952 | 11/1968 | Ross | 317/235 N |
| 3,482,198 | 12/1969 | Hopper | 317/235 N |
| 3,502,507 | 3/1970 | Mann | 317/235 N |
| 3,575,721 | 4/1971 | Mann | 317/235 N |

*Primary Examiner*—James W. Lawrence
*Assistant Examiner*—D. C. Nelms
*Attorney, Agent, or Firm*—W. H. MacAllister, Jr.; Lewis B. Sternfels

[57] ABSTRACT

At least an increase of four percent in useful output from a photocell area without increasing the size or weight of the cell results from feeding a connecting wire from the front side of the cell to its backside through a small, centrally located hole in the cell. Grid lines on the front side run radially to a ring of metal around the hole. Various means on the backside are used to connect the connecting wire to a bus or interconnect. Thus, not only the useful cell area but also the packing densities of a number of cells is increased.

10 Claims, 4 Drawing Figures

SOLAR CELL CONTACT DESIGN

BACKGROUND OF THE INVENTION

1. Field of the Invention

The present invention relates to solar cells, and in particular, to interconnects therefor.

2. Description of the Prior Art

Conventional photocells generally comprise a wafer of semiconductor material, such as doped silicon crystals, which is sensitive to light. Upon exposure thereto, the semiconducting material generates current which is picked up by conductive strips lying across the upper surface of the cell. These strips are connected to a common lead or contact bar placed along one edge on this top surface of the cell. At the back surface of the cell is a back conductor and the back conductor of one cell is secured to the front conductor of an adjacent cell in series to augment the small power output thereof. Such a contact bar covers approximately 5% of the top surface. Because of the need to interconnect one cell with an adjacent cell, a spacing between cells is required to permit a back contact of one cell to connect with a front contact bar of its adjacent cell. This construction results in inefficient packing density of cells.

SUMMARY OF THE INVENTION

The present invention overcomes these and other problems and disadvantages by so constructing each solar cell that front leads are passed to a metal ring and thence through a centrally located hole in the cell instead of across its top surface. The resulting area used for the metal ring in place of the conventional contact bar can be reduced with no increase in the basic cell resistance. Furthermore, by passing the leads through the cell, all interconnects can be made at the backsides of all cells, which avoids the need to utilize a spacing between cells for this purpose.

It is, therefore, an object of the present invention to provide an improved solar cell construction.

Another object is to increase the useful photocell current generating area.

Another object is to decrease power ($I^2R$) losses at the cell.

Another object is to provide greater solar cell packing density.

Another object is to increase the efficiency of solar cell design.

Another object is improved assembly techniques.

Other aims and objects, as well as a more complete understanding of the present invention, will appear from the following explanation of an exemplary embodiment and the accompanying drawings thereof.

DESCRIPTION OF THE PREFERRED EMBODIMENT

Figure 1:
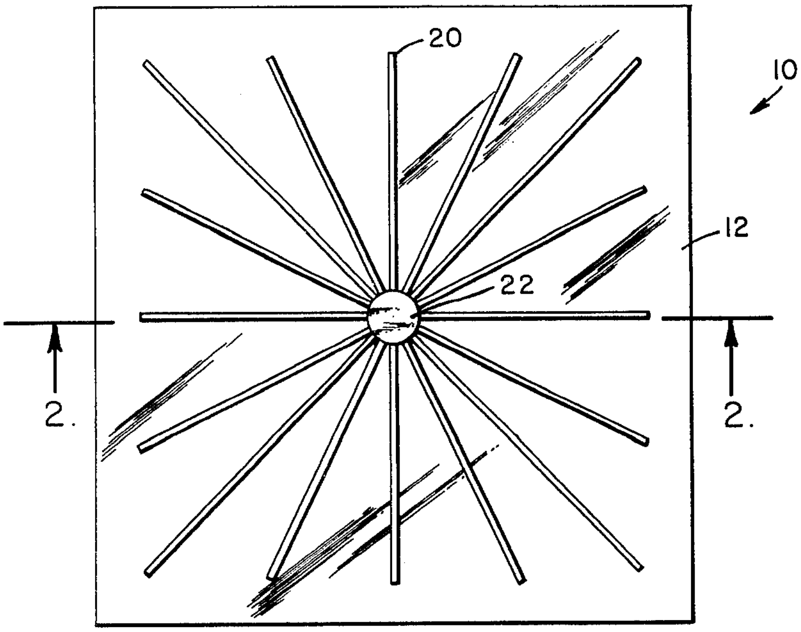
FIG. 1 is a top view of a solar or photovoltaic cell.
Figure 2:
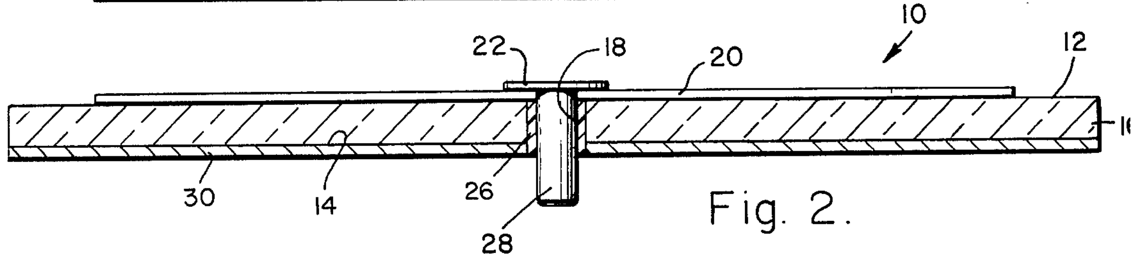
FIG. 2 is a cross section of the cell of FIG. 1 taken along lines 2—2 thereof.

A photovoltaic or solar cell 10 comprises a front surface 12 and a rear surface 14 of a wafer of suitable semiconductor material 16 cut from a crystal of semiconductor material such as silicon. Machined or otherwise formed through semiconductor material 16 is a centrally located hole 18 which extends from surface 12 to back surface 14. Placed across the front surface of the cell is a pattern or plurality of current pick-up paths or grid lines or rays 20. A metal conductor ring 22 is placed about hole 18 and paths 20 are coupled thereto. In FIG. 1, the paths are depicted as radiating from ring 22 in a radial manner while in FIGS. 3 and 4 additional paths 20*a*, 20*b* and 20*c* are illustrated as variations in the manner in which the grid lines may be designed. A metal layer 30 is adhered to backside 14 of semiconductor material 16. Within hole 18 and extending up to paths 20 and through metal layer 30 is electrical insulation material, such as tubular insulation portion 26 to form an insulated hole. A "front" contact 28 is electrically coupled to paths 20 and extends through hole 18. Contact 28 and metal layer 30 of different cells may be electrically coupled to each other and to any other cells in any convenient manner, and the cells may be mounted on any suitable plastic sheet.

Figure 3:
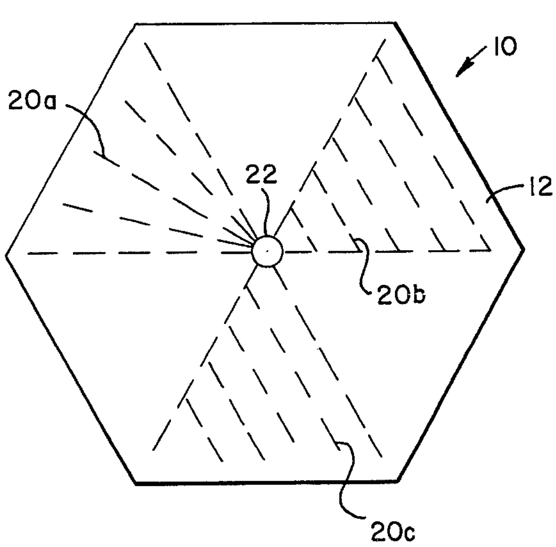
FIGS. 3 and 4 are alternate grid line patterns.
Figure 4:
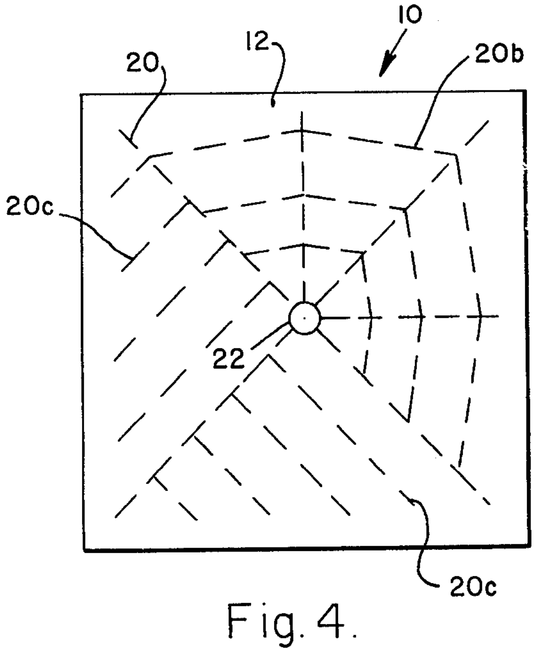

As further depicted in FIG. 3, cell 10 may be configured as a hexagon so that a plurality of cells may have a honeycomb shape.

Through use of the present invention, several advantages may be obtained. For example, at least a gain on the order of 4% is possible by increasing the active area. The contact bar presently covers 1 mm/20 mm or 5%. Hole and ring structure will cover $\pi/4 \cdot 3^2/400 \approx 2\%$ with a ring of 3mm dia. or 1% with a ring of 2 mm OD. A difference of 4% active area would yield an increase to 130 mA for a cell that normally has an output of 125 mA. As to packing density, compared to present techniques, cells can be placed closer together since no spacing needs to be allowed for interconnects. Radiation protection can be furnished by a cover slide covering the entire cell area. To make the cell flush for application of the coverslide, it may be desirable to make the area around the center hole slightly recessed before forming the junction and the contacts. All interconnect attachments are made on the back of the cell, which facilitates assembly techniques. Other cell shapes rather than square or rectangular, such as hexagonal, are made possible. This would offer better utilization of the shape in which silicon crystals are grown which, in turn, would result in a larger and cheaper cell. A panel assembly would then have a honeycomb appearance. Total front contact resistance can be reduced with the spiderweb design, to an estimated 70% of its previous value. Etch back problems of the cell with contact bar are eliminated, that is removal by etching of any junction material that is exposed to radiation, such as along the contact bar. Because no junction area is allowed to be exposed the contact bar comes precariously close to the edge of the cell, and to the bulk material.

Adjacent cells may be placed in closer proximity than otherwise possible with an accompanying increase in cell density for an array of cells. Furthermore, since all interconnects are made at the backside of the cell, assembly techniques are facilitated. Additionally, the cell shape may then be configured other than in the conventional rectangular design, e.g., to a hexagonal configuration, to offer a better utilization of the shape in which silicon crystals are grown, resulting in possibly larger and cheaper cells. Contact resistance can be also reduced by redesign of the grid lines, such as to a spider-web design. Because the contact bar is eliminated, etch back problems are eliminated by permitting no junction area to be exposed to radiation. As a consequence of the construction of the present invention, for a given area and weight of photocell arrays, an increase in power can be obtained along with a reduction of resistance of the cells.

Although the invention has been described with reference to particular embodiments thereof, it should be realized that various changes or modifications may be made therein without departing from the spirit and scope of the invention.

What is claimed is:

1. A solar cell array comprising:

a plurality of solar cells placed substantially in juxtaposed contact with one another;

each of said cells including a flat wafer of light sensitive semiconductor material having an upper surface and a lower surface and means for defining a hole substantially centrally located in and extending through said flat wafer of light sensitive semiconductor material from said upper surface to said lower surface;

a central conductor ring placed about said hole means;

a pattern of electrical current pick-up paths on said upper surface radiating from said central conductor ring;

first conductor means secured to said lower surface;

tubular insulation material extending through said hole means;

second conductor means including a conductive lead integral therewith and extending through said tubular insulation material and said hole means and into electrical affixation with said central conductor ring; and said first conductive means of each one of said solar cells being electrically secured to said second conductive means of adjacent ones of said solar cells in series electrical connection.

2. A photovoltaic device comprising a member of current generating material, means for defining at least one current pick-up path comprising at least one elongated conductor on one surface of said member, means defining a hole in said member and extending through said member from said current pick-up path means to a second surface of said member, a first current-carrying conductor coupled to said second surface with said hole means extending therethrough, and a second current-carrying conductor on said second surface having means for electrically insulating said second current-carrying conductor and said member from said first current-carrying conductor and electrically coupled to said current pick-up path means through said hole means.

3. A device as in claim 2 wherein said first current-carrying conductor comprises a metal layer bonded to said member at said second surface, and further including insulation material electrically insulating said second current-carrying conductor from said metal layer.

4. A device as in claim 2 wherein said hole means is substantially centrally located in said member.

5. A device as in claim 4 further including a plurality of elongated conductors radiating from said hole means for defining a pattern of conductor rays.

6. A device as in claim 3 wherein said second current-carrying conductor comprises a second metal layer bonded to said layer of insulation.

7. A device as in claim 2 further including a metal ring electrically coupling said current pick-up path means at said one surface of said member.

8. A device as in claim 7 wherein said current pick-up path means comprises a plurality of radially extending grid lines radiating from said metal ring on said one surface of said member, said member being otherwise free from conductive leads on said one surface and including means below said one surface for coupling said grid lines for maximizing the area of said one surface and for maximizing exposure of said light sensitive, current generating material to light.

9. A device as in claim 8 wherein said grid lines comprise a plurality of secondary lines in parallel configuration extending from at least one of said grid lines.

10. A device as in claim 2 wherein said member is configured as a hexagon.

* * * * *